United States Patent [19]

Tihanyi et al.

[11] Patent Number: 4,578,596
[45] Date of Patent: Mar. 25, 1986

[54] CIRCUIT ARRANGEMENT FOR DRIVING A THYRISTOR WITH A PHOTOTRANSISTOR

[75] Inventors: Jenoë Tihanyi; Christine Fellinger; Ludwig Leipold, all of Munich, Fed. Rep. of Germany

[73] Assignee: Siemens Aktiengesellschaft, Berlin & Munich, Fed. Rep. of Germany

[21] Appl. No.: 664,380

[22] Filed: Oct. 24, 1984

[30] Foreign Application Priority Data

Dec. 8, 1983 [DE] Fed. Rep. of Germany ....... 3344435

[51] Int. Cl.[4] .................. H03K 17/60; H03K 3/45; H03K 17/687
[52] U.S. Cl. ................. 307/252 R; 307/252 N; 307/252 UA; 307/311; 307/580
[58] Field of Search ........... 307/252 R, 252 N, 252 U, 307/570; 307/311, 581

[56] References Cited

U.S. PATENT DOCUMENTS

| | | | |
|---|---|---|---|
| 3,663,838 | 5/1972 | Reimèrs | 307/311 |
| 4,021,683 | 5/1977 | Splatt | 307/252 UA |
| 4,217,618 | 8/1980 | Kellenbenz et al. | 307/311 |
| 4,295,058 | 10/1981 | Lade et al. | 307/252 UA |
| 4,324,989 | 4/1982 | Stut | 307/252 UA |
| 4,535,251 | 8/1985 | Herman et al. | 307/311 |

OTHER PUBLICATIONS

Siemens Components XVII (1982), No. 3, "Solid State Relays (SSR)—Performance and Practical Use", by Walter Brunnler, pp. 83 to 87.

*Primary Examiner*—Stanley D. Miller
*Assistant Examiner*—B. P. Davis
*Attorney, Agent, or Firm*—Hill, Van Santen, Steadman & Simpson

[57] ABSTRACT

In a circuit arrangement for drive of a thyristor with a phototransistor, the collector-emitter path of the phototransistor is between one of two alternating voltage terminals and a gate terminal of the thyristor. In order to prevent an activation of the unilluminated phototransistor due to a steep voltage edge (dv/dt) load), its base current given such a load is carried off via an IGFET of the enhancement type. This IGFET is controlled by an IGFET of the depletion type acting as a current source which lies between a gate terminal and source terminal of the enhancement type IGFET. A capacitor is connected in series with the depletion-type IGFET. This series connection lies between the two alternating voltage terminals.

6 Claims, 2 Drawing Figures

CIRCUIT ARRANGEMENT FOR DRIVING A THYRISTOR WITH A PHOTOTRANSISTOR

BACKGROUND OF THE INVENTION

The invention relates to a circuit arrangement for driving with a phototransistor at least one thyristor connected to an alternating voltage.

Such a circuit arrangement has been described, for example, in "Siemens Components", 20 (1982), No. 3, pages 83 ff., particularly FIG. 2, all incorporated herein by reference. Given this circuit arrangement, the phototransistor controls the thyristor via an auxiliary transistor, whereby the collector-emitter path of the auxiliary transistor is parallel to the gate-collector path of the thyristor. The collector-emitter path of the phototransistor is connected via resistors to an alternating voltage proportional to the line voltage. In order to prevent an activation of the unilluminated phototransistor at rising voltage edges (dv/dt load), an RC series connection is connected parallel to the circuit arrangement at the output side. This simultaneously serves for compensation of phase changes produced by inductive loads. 100 Ohms is proposed, for example, as a resistance and 0.1 $\mu$F as a capacitance. This means that a quiescent current on the order of a few mA can flow in the idle condition, i.e. given a switched off thyristor. Furthermore, such an RC wiring is poorly suited for integration given the specified dimensions.

SUMMARY OF THE INVENTION

An object of the invention is to improve a circuit arrangement of the type initially cited such that the flowing quiescent current is significantly lower. Furthermore, the components provided for protection against dv/dt stresses should be capable of being easily constructed in integrated form.

This object is achieved by means of the following features:

(a) The emitter-collector path of the phototransistor is connected between a first of two alternating voltage terminals and the gate terminal of the thyristor;

(b) The drain-source path of an IGFET of the enhancement type is connected between the base terminal of the phototransistor and the second alternating voltage terminal;

(c) The drain-source path of an IGFET of the depletion type is connected between the gate terminal and the source terminal of the IGFET of the enhancement type;

(d) The gate terminal of the depletion-type IGFET and its source terminal are electrically connected to the second alternating voltage terminal; and (e) A capacitor is connected between the gate terminal of the depletion-type IGFET and the first alternating voltage terminal.

DESCRIPTION OF THE PREFERRED EMBODIMENTS

Figure 1:
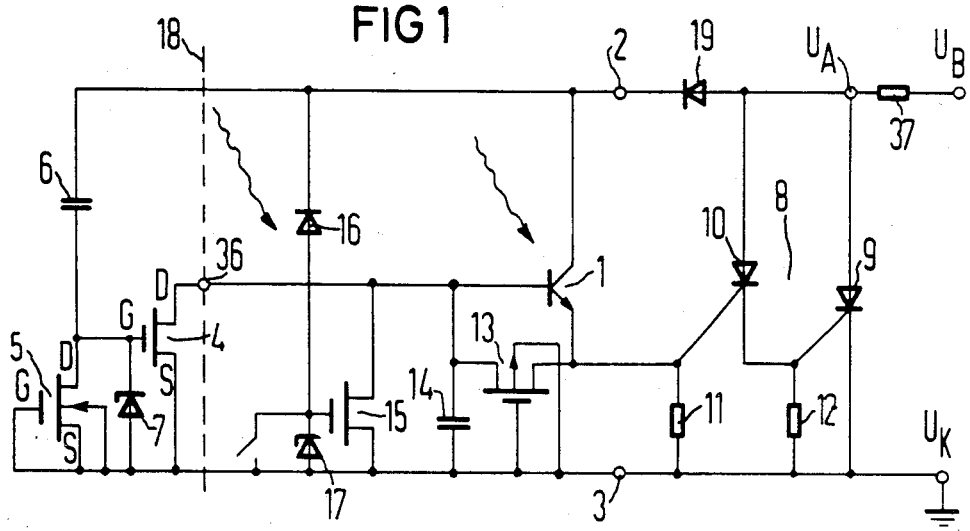
FIG. 1 illustrates a circuit of an electronic load relay with a dv/dt protection circuit according to the invention.

The circuit arrangement of FIG. 1 contains a phototransistor 1. The collector-emitter path of the phototransistor 1 lies between a first terminal 2 of two alternating voltage terminals 2, 3 and the gate terminal of a thyristor arrangement 8. This thyristor arrangement 8 can be formed of a single thyristor, of a cascade connection of two thyristors, or of a thyristor 9 comprising an integrated auxiliary thyristor 10 which amplifies the ignition current. Resistors 11 or 12 lie between the gate terminals of the thyristors 10, 9 and the alternating voltage terminal 3, these resistors serving in known fashion to improve the dv/dt properties of the thyristors.

The source-drain path of an enhancement-type IGFET 4 lies between the base terminal of the phototransistor 1 and the alternating voltage terminal 3. The source-drain path of a depletion-type IGFET 5 lies between the gate terminal and the source terminal of the IGFET 4. The gate terminal of this IGFET is connected to its source terminal. The source terminals of the IGFETs 4, 5 lie at a fixed potential, preferably at cathode potential $U_K$ of the thyristor 9, i.e. at ground. A capacitor lies between the gate terminal of the IGFET 4 or the drain terminal of the IGFET 5 and the alternating voltage terminal 2.

The alternating voltage terminal 2 can lie at the potential $U_A$ of the anode of the thyristor 9. Preferably, however, a diode 19 is connected between the anode of the thyristor 9 and the alternating voltage terminal 2, said diode only being conductive when voltage in a conducting direction is present at the thyristor. A load of the phototransistor 1 in a non-conducting direction is thus avoided.

When a voltage in a conducting direction is connected to the thyristor 9 or to the thyristor arrangement 8 and the phototransistor 1 is illuminated, then a transistor current flows through the load 37, the diode 19, and the transistor 1 into the gate terminal of the thyristor 10. This ignites and thus switches the thyristor 9 on. Parallel to the transistor current, a current flows through the capacitor 6 and the IGFET 5 to the alternating voltage source 3. The IGFET 5 is of the depletion type and is therefore conductive given the gate-source voltage 0 V. The drain-source path of the IGFET 5 becomes more and more high resistance with increasing drain-source voltage. As will be explained in greater detail in conjunction with FIG. 2, the IGFET 5 functions, by suitable dimensioning, as a current generator, i.e. carries a practically constant current. The capacitor 6 is thus charged with constant current and the gate-source bias voltage of the IGFET 4 rises. This is dimensioned such that its threshold voltage is not reached given a normal voltage rise. Further explanations about the dimensioning can likewise be derived from the description to FIG. 2.

When the voltage at the alternating voltage terminal 2 rises very quickly, for example with a steepness of $10^6$ V/$\mu$s, then a constant current continues to flow through the IGFET 5 due to the property cited above. The major part of the capacitor current can now flow to the gate of the IGFET 4 and charges its source-gate capacitance. When the threshold voltage of the IGFET 4 is reached, it becomes conductive and carries off the base current of the phototransistor 1. This can thus not become conductive and the thyristors remain inhibited.

The activation of the IGFET 4 before the phototransistor 1 is assured by providing the base-collector capacitance of the phototransistor 1 generally significantly greater than the gate-source capacitance of the IGFET 4. Should this not be the case, then a capacitor 14 can be inserted between the base terminal of the phototransistor 1 and and the alternating voltage terminal 3.

A Zener diode 7 can be connected between gate terminal and source terminal for limiting the gate-source voltage of the IGFET 4. This Zener diode 7 then limits the gate-source voltage to a value of, for example, 10 V which is non-hazardous to the gate oxide.

The circuit arrangement of FIG. 1 can be provided with a zero point control which guarantees that emitter current only flows in the phototransistor 1 when the voltage at the alternating voltage terminals 2, 3 has not exceeded a specific value. This zero point control is formed of an enhancement-type IGFET 15 whose drain-source path lies between the base terminal of the phototransistor 1 and the alternating voltage terminal 3. The gate terminal of the IGFET 15 is connected to the alternating voltage terminal 2 via a photodiode 16. A Zener diode 17 can again lie between the gate terminal of the IGFET 15 and the alternating voltage terminal 3 for protection of the gate oxide of the IGFET 15. The photodiode 16 is illuminated either by the light source of the phototransistor 1 or by a second light source operating synchronously therewith. When the alternating voltage at the terminals 2, 3 rises above the permitted voltage and the photodiode 16 and the phototransistor 1 are illuminated, then a current flows through the photodiode 16 to the gate terminal of the IGFET 15 and switches this on before the phototransistor 1 can become conductive. The reason for this may be found in the significantly smaller gate-source capacitance of the IGFET 15 in comparison to the collector-base capacitance of the phototransistor 1. Capacitor 14 delays the activation of the phototransistor 1 even in the described case of zero point control.

The drain-source path of a further depletion-type IGFET 13 can be connected between the base terminal and the emitter terminal of the phototransistor 1. Its gate terminal is connected to the second alternating voltage terminal 3. This IGFET represents a variable resistor which presents a low resistance in the unilluminated condition of the phototransistor 1, and a high resistance in the illuminated condition of the phototransistor 1. The reverse current strength of the phototransistor 1 is thus elevated and the current gain is not deteriorated in the illuminated case.

Figure 2:
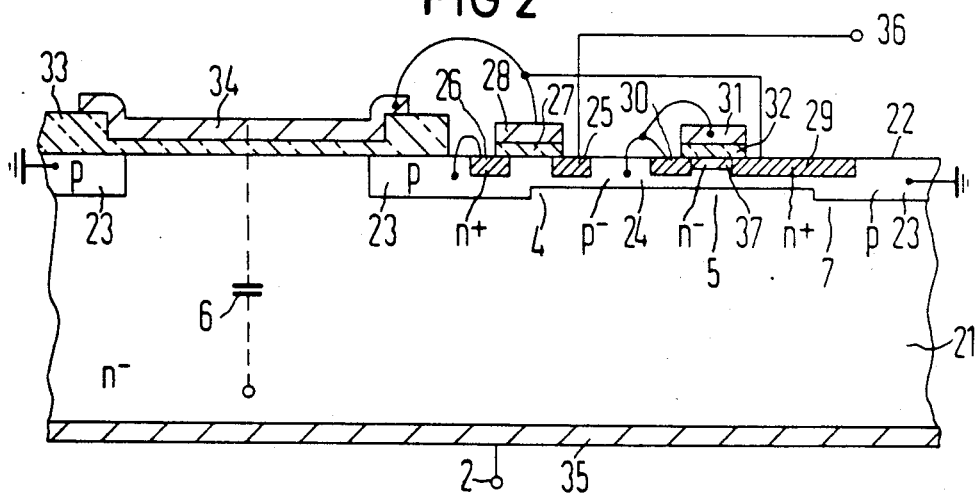
FIG. 2 illustrates components in integrated form of the dv/dt protection circuit shown to the left of the broken line 18 in FIG. 1.

The same reference characters have been employed in the integrated circuit format of FIG. 2 for the identification of parts identical to those in FIG. 1. The basis of the integrated circuit is a semiconductor body 21. A substrate 22 of the opposite conductivity type is planarly embedded into the semiconductor body for the IGFETs 4, 5 and the Zener diode 7. This substrate 22 comprises more highly doped parts 23 and a more weakly doped part 24. The parts can have different thicknesses but can also be of the same thickness. A drain zone 25 and a source zone 26 for the IGFET 4 is planarly embedded into the substrate. A first insulating layer 27, for example, of silicon dioxide is disposed on the semiconductor body 21, and a gate electrode 28 is seated on the first insulating layer. The gate electrode 28 at least partially overlaps the zones 25, 26. The drain zone 29 and the source zone 30 for the IGFET 5 are planarly embedded into the same substrate 22. A gate zone 37 is embedded between these two zones. The insulating layer of the IGFET 5 is referenced 32 and at least partially overlaps the source zone 30 and the drain zone 29. A gate electrode 31 which is electrically connected to the source zone 30 and to the substrate is seated over the insulating layer 32. The substrate preferably lies at cathode potential or at ground potential, whereby capacitatively generated currents are carried off and do not cause any disturbances in the circuit.

The drain zone 29 of the IGFET 5 extends into one of the more highly doped parts 23 of the substrate 22. Since the drain zone is highly doped, the pn junction placed between the drain zone 29 and the highly doped part 23 of the substrate 22 collapses at low voltages, for example at 10 V. This corresponds to the function of the Zener diode 7 and limits the gate potential for the IGFET 4 to a value that is non-hazardous for its insulating layer 27.

The capacitor 6 comprises an electrode 34 which consists, for example, of highly n-doped polycrystalline silicon. The electrode 34 is disposed on an insulating layer 33 lying on the surface of the semiconductor body 21. This insulating layer 33 can likewise be formed of silicon dioxide. A zone having a conductivity type opposite that of the semiconductor body 21 lies under the edge of the capacitor electrode 34. This zone can preferably be formed by one of the relatively highly doped parts 23 of the substrate 22. At the edge above the zone or part 23, the capacitor electrode can have a graduation which lies on a correspondingly thicker part of the insulating layer 33. Either alone or in combination with the graduation of the capacitor electrode 34, part 23 prevents a discharge of charge carriers out of the capacitor. The zones of the integrated circuit of FIG. 2 can have the indicated conductivity types and the indicated, rough sub-division of the doping concentrations. All zones, however, can also have the inverse conductivity types. The doping and dimensions of the individual components can have the following values:

Resistivity of the semiconductor body equal to 30 to 50 Ohm cm.

Thickness of 200 to 300 $\mu$m.

Doping of the highly p-doped zones equal to $10^{17}$ to $10^{18}$ atoms cm$^{-3}$.

Doping of the weakly p-doped parts equal to $10^{16}$ atoms cm$^{-3}$.

Doping of the gate zone 37 by means of arsenic implantation of, for example $1 \times 10^{12}$ atoms cm$^{-2}$.

Distance of the drain zones from the source zones—5 to 200 $\mu$m.

Thickness of the thicker part of the insulating layer 33–1.5 $\mu$m.

Depth of the highly p-doped zones—1 through 4 $\mu$m.

Thickness of the oxide layers 32 and 37 equal to 70 nm.

Thickness of the highly n-doped zones—0.15 to 2 $\mu$m.

Dimension of the capacitor electrode 34—100×100 $\mu$m.

Thus, for the capacitor (dependent on the voltage $U_B$–$U_K$) a size of about 2 to 6 pF results. The threshold voltages of the IGFETs 4 and 5 can be defined in a known way by the thickness of the insulating layers 27, 32 and by the resistivity of the gate zones. The resistivity of the gate zone for the IGFET 4 can, as shown, also be set such that it partially encompasses the more highly doped part 23 and partially encompasses the more weakly doped part 24 of the substrate 22. The threshold voltages of the IGFETs 4 and 5 lie between 4 and 10 V, given the specified dopings and dimensions.

The operating voltage is supplied to the semiconductor body via an electrode 35. A terminal 36 is provided for connecting the parts lying to the right of the broken line (in FIG. 1) to the arrangement of FIG. 2.

Although various minor changes and modifications might be proposed by those skilled in the art, it will be understood that we wish to include within the claims of the patent warranted hereon all such changes and modifications as reasonably come within our contribution to the art.

We claim as our invention:

1. A circuit arrangement for driving at least one thyristor connected to an alternating voltage from a phototransistor, comprising:
    (a) a phototransistor connected to drive the thyristor connected to an alternating voltage;
    (b) an emitter-collector path of said phototransistor connected between a first of two alternating voltage terminals and a gate terminal of said thyristor;
    (c) a drain-source path of an enhancement type IGFET connected between a base terminal of said phototransistor and a second of said two alternating voltage terminals;
    (d) a drain-source path of a depletion type IGFET connected between a gate terminal and a source terminal of said enhancement type IGFET;
    (e) a gate terminal of said depletion type IGFET and a source terminal thereof being electrically connected to said second alternating voltage terminal; and
    (f) a capacitor connected between the drain terminal of said depletion type IGFET and said first alternating voltage terminal.

2. A circuit arrangement of claim 1 wherein said second alternating voltage terminal is electrically connected to a cathode terminal of said thyristor.

3. A circuit arrangement of claim 1 wherein a Zener diode is connected between the gate terminal of said enhancement-type IGFET and the source terminal thereof.

4. A circuit arrangement of claim 1 wherein a diode is connected between an anode terminal of said thyristor and said first alternating voltage terminal, said diode being poled such that it is reverse biased when voltage in a non-conducting direction is fed to said thyristor.

5. A circuit arrangement for driving at least one thyristor connected to an alternating voltage from a phototransistor, comprising:
    a phototransistor having its collector connected to a first alternating voltage terminal and its emitter available for driving a thyristor;
    a first IGFET having its drain-source path connected between a base of the phototransistor and a second alternating voltage terminal;
    a second IGFET having its drain-source path connected between a gate of the first IGFET and the second alternating voltage terminal, its gate being connected to its source; and
    a capacitor connecting between the first alternating voltage terminal and the gate of the first IGFET.

6. A circuit arrangement according to claim 5 wherein an anode of the thyristor connects through a diode to the first terminal, its cathode connects to a second terminal, and its gate connects to the emitter of the phototransistor.

* * * * *